US009136075B2

(12) United States Patent
Chun

(10) Patent No.: US 9,136,075 B2
(45) Date of Patent: Sep. 15, 2015

(54) SWITCH MODULE BUILT IN STEERING WHEEL

(75) Inventor: Joo Young Chun, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 638 days.

(21) Appl. No.: 13/466,599

(22) Filed: May 8, 2012

(65) Prior Publication Data

US 2013/0147284 A1 Jun. 13, 2013

(30) Foreign Application Priority Data

Dec. 9, 2011 (KR) ........................ 10-2011-0131713

(51) Int. Cl.
*H03K 17/965* (2006.01)
*H01H 25/00* (2006.01)
*H01H 3/00* (2006.01)

(52) U.S. Cl.
CPC ......... *H01H 25/00* (2013.01); *H01H 2003/008* (2013.01); *H01H 2215/03* (2013.01); *Y10T 307/786* (2015.04)

(58) Field of Classification Search
USPC .................................. 307/112, 119, 9.1–10.1
See application file for complete search history.

(56) References Cited

U.S. PATENT DOCUMENTS

| | | | | |
|---|---|---|---|---|
| 7,954,399 | B2 | 6/2011 | Rubboli | |
| 2011/0241850 | A1* | 10/2011 | Bosch et al. | 340/384.6 |
| 2012/0172710 | A1* | 7/2012 | Anthony et al. | 600/411 |

FOREIGN PATENT DOCUMENTS

| | | | |
|---|---|---|---|
| EP | 2 123 537 | A1 | 11/2009 |
| JP | 2000168468 | A | 6/2000 |
| JP | 2007-076491 | A | 3/2007 |
| JP | 2008041370 | A | 2/2008 |
| JP | 2008087566 | A | 4/2008 |
| JP | 2008168840 | A | 7/2008 |
| JP | 2008301959 | A | 12/2008 |
| KR | 10-0985283 | | 8/2009 |
| KR | 10-2011-0070738 | | 6/2011 |
| WO | 2008133099 | A1 | 11/2008 |

* cited by examiner

*Primary Examiner* — Jared Fureman
*Assistant Examiner* — Aqeel Bukhari
(74) *Attorney, Agent, or Firm* — Mintz Levin Cohn Ferris Glovsky and Popeo, P.C.; Peter F. Corless

(57) ABSTRACT

Disclosed is a switch module located within a steering wheel of a vehicle that includes an input switch module, a feedback module, and a controller. The input switch module allows a driver to conduct a variety of switching operations by, for example, pressing the left, right, front, or back of the steering wheel, or by making a leftward or rightward torsional motion or a leftward or rightward diagonal motion with respect to the steering wheel. The switch module controller receives inputs from the input switch module that correlate to these switching operations, and outputs a signal to a vehicle device such as, for example, a head up display, and also to a feedback module, which provides a feedback response to the driver confirming the switching operation. The present invention allows the driver to control vehicle devices and systems while maintaining contact with the steering wheel, thereby improving vehicle safety.

16 Claims, 5 Drawing Sheets

SWITCH MODULE BUILT IN STEERING WHEEL

CROSS-REFERENCE TO RELATED APPLICATION

This application claims under 35 U.S.C. §119(a) the benefit of Korean Patent Application No. 10-2011-0131713 filed on Dec. 9, 2011, the entire contents of which are incorporated herein by reference.

BACKGROUND (a) Technical Field

The present invention relates to a switch module built into a steering wheel. More particularly, the invention relates to a switch module in which an input switch module and a feedback module are combined and installed within the steering wheel, so that a switching operation can be performed while a driver is holding the steering wheel.

(b) Background Art

A steering wheel is designed to control the direction of a vehicle, and typically includes a grip portion in the form of a circular ring, an airbag module installed in the inner diameter of the grip portion, and a horn. A variety of switches are generally mounted around the grip portion of the steering wheel, or the airbag module, in order to operate a variety of vehicle functions such as Audio, Video, and Navigation (AVN), a Head Up Display (HUD), or the like.

Conventional art switches are generally small and arranged around the grip portion of the steering wheel in complicated patterns; consequently they have the major drawback of requiring that a driver release the grip portion of the steering wheel in order to operate the switches, thereby creating a hazardous and unsafe driving condition. Additionally, such conventional art switches are disadvantageous because their small size and complicated layout increase the likelihood that a driver will inadvertently touch the wrong switch.

In view of the foregoing, it is clear that there is a need for switches that will allow a driver to control vehicle functions, such as AVN, HUD, or the like, while allowing the driver's hands to maintain constant contact with the grip portion of the steering wheel.

SUMMARY OF THE DISCLOSURE

The present invention provides a switch module that may be built into a steering wheel. The switch module includes an input switch module and a feedback module. The input switch module includes a force-torque sensor that functions by receiving a torque operating force such as for example, a holding force or a torsional force, from a driver. The feedback module functions by providing a feedback sensation (e.g. auditory signal or vibration) to the driver, thereby allowing the driver to confirm that the switching function was actuated. When the switch module is installed within the steering wheel, switching operation of the input switch module can be performed by a variety of actions by the driver, such as, for example, pressing the steering wheel forward or backward, or twisting the steering wheel leftward or rightward, while maintaining contact between the driver's hands and the steering wheel.

In one aspect, the present invention provides a switch module built into the grip portion of a steering wheel that includes an input switch module having a force-torque sensor operated by total of seven (7) motions including: a push or pull motion, a brief pressing motion, a leftward or rightward torsional motion, and a wrapping motion in a left or right diagonal direction. Additionally, the switch module includes a feedback module for providing a feedback sensation (e.g. auditory signal or vibration) to the driver.

In an exemplary embodiment, the switch module built into the grip portion of the steering wheel in accordance with the present invention may further include a controller that operates the feedback module by sensing an output signal that correlates to the operation of the input switch module.

In another exemplary embodiment, the input switch module includes a first securing block fixed to a first transverse section of the grip portion of the steering wheel; a displaceable block torsionally displaceably mounted to the first securing block; a second securing block fixed to a second transverse section of the grip portion of the steering wheel; a six axis force-torque sensor located in between, and connected to, the displaceable block and the second securing block; and a plurality of input links connected to the displaceable block and the outer surface of the second securing block for applying a force or torque to the six axis force-torque sensor. The first and second transverse sections span the inner diameter and the outer diameter of the steering wheel, and are separated by a circumferential distance that corresponds approximately to the distance between the first and second securing blocks.

In still another exemplary embodiment, a bonding substance of a flexible material is sandwiched between the first securing block and the displaceable block.

In yet another exemplary embodiment, an input link may include a pair of hinge links and an elastic link, whereby a first end of the pair of hinge links is pivotally engaged in a slot formed at the outer surface of the displaceable block; and the second end of the pair of hinge links is pivotally engaged to a first end of the elastic link, while the second end of the elastic link is fixed to the outer surface of the second securing block.

In still yet another exemplary embodiment, the displaceable block and the second securing block of the input switch module are integrally connected to each other by a connecting block, and a feedback module is installed within the connecting block.

In a further exemplary embodiment, the feedback module is separately encased at a location in the grip portion of the steering wheel adjacent to the input switch module.

In another exemplary embodiment, the feedback module is employed as a vibration motor to be vibrated upon receiving an operating signal from a controller.

According to the present invention, an input switch module having a force-torque sensor and a feedback module may be installed within the steering wheel, such that operation of the installed input switch module may be performed by a variety of driver actions, such as, for example, pressing the steering wheel forward or backward, or twisting the steering wheel leftward or rightward. Accordingly, the invention allows driver to easily operate the input switch module while maintaining contact with the grip portion of the steering wheel, thereby allowing the driver to maintain safe control of the vehicle. Additionally, since a variety of switches may (e.g. AVN, HUD, or the like) be integrated within one input switch module, the invention makes it possible to easily and safely operate all of the switches, while simultaneously providing a neat appearance by removing the myriad of small, obtusely arranged switches typical of the conventional art.

Furthermore, it should be appreciated that the driver can detect the completion of the switching operation because a vibration outputted from the feedback module is made after the switching operation has been input into the input switch module.

BRIEF DESCRIPTION OF THE DRAWINGS

The above and other features of the present invention will now be described in detail with reference to certain exemplary embodiments thereof illustrated in the accompanying drawings which are given herein below by way of illustration only, and thus are not limitative of the present invention, and wherein.

DETAILED DESCRIPTION

Hereinafter, reference will now be made in detail to various embodiments of the present invention, examples of which are illustrated in the accompanying drawings and described below. While the invention will be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

Figure 1:
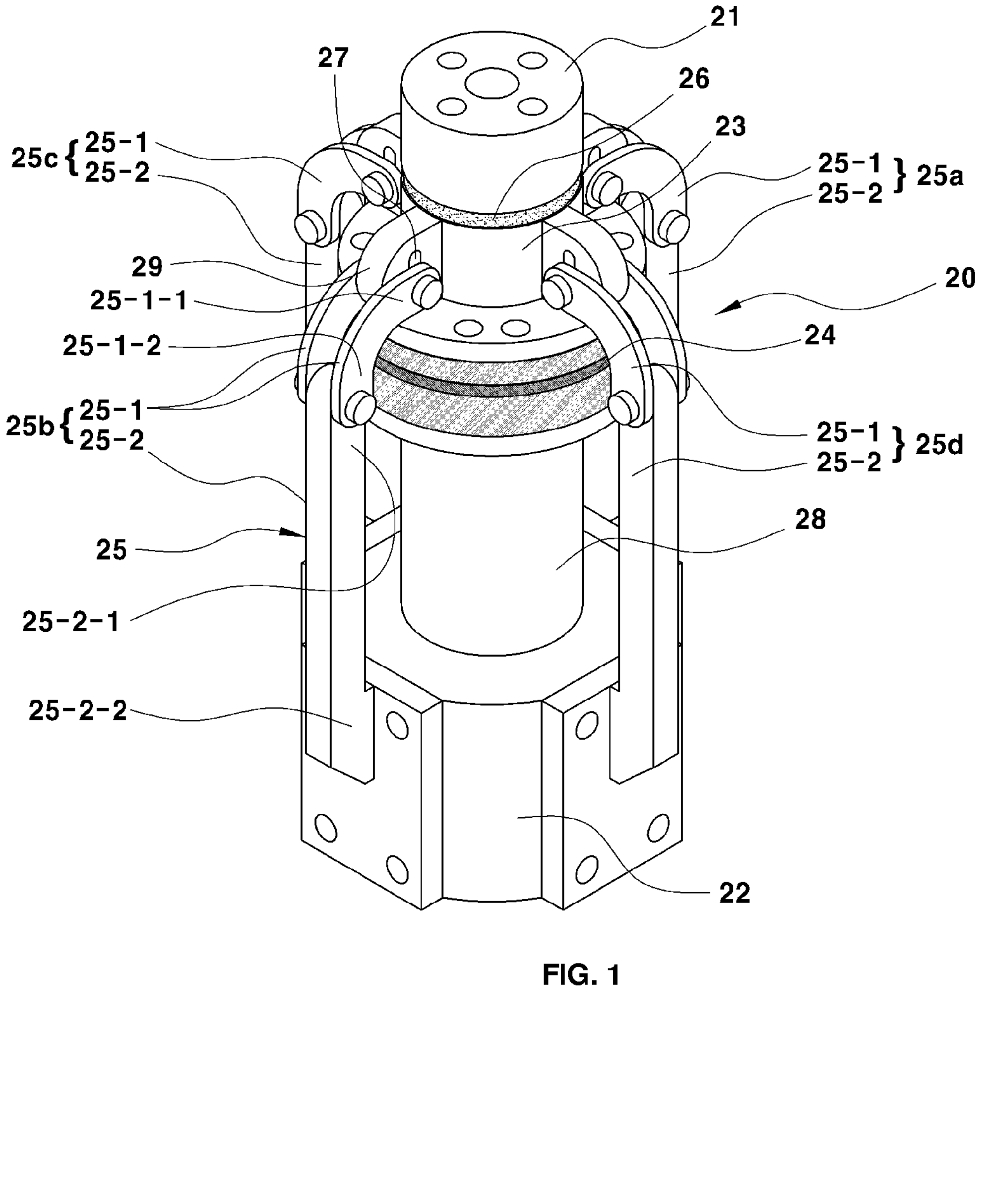
FIG. 1 is a perspective view illustrating an input switch module in accordance with the present invention.

As shown in FIG. 1, the input switch module 20 includes a first securing block 21, a displaceable block 23, a six axis force torque sensor 24, a connecting block 28, and a second securing block 22. The first securing block 21 and the second securing block 22 secure the respective ends of the input switch module 20 within the steering wheel. The displaceable block 23 is torsionally displaceably mounted to the first securing block 21. A bonding substance 26 may be sandwiched in between the first securing block 21 and the displaceable block 23. The displaceable block 23 is connected to a connecting block 28 via a six axis force-torque sensor 24, which is located in between the displaceable block 23 and the connecting block 28. The connecting block 28 is connected to the second securing block 22. A plurality of input links 25 are connected to the displaceable block 23 and the outer surface of the second securing block 22, and function to apply a force or torque to the six axis force-torque sensor 24. Each of the input links 25 includes a pair of hinge links 25-1 and an elastic link 25-2. A first end 25-1-1 of the pair of hinge links 25-1 is pivotally engaged in a slot 27 formed at the outer surface of the displaceable block 23, and the second end 25-1-2 of the pair of hinge links 25-1 is pivotally engaged to a first end

25-2-1 of the elastic link 25-2, while the second end 25-2-2 of the elastic link 25-2 is fixed to the outer surface of the second securing block 22. In the exemplary embodiment shown, there are four input links 25: a front input link 25*a*, a rear input link 25*b*, a left input link 25*c*, and a right input link 25*d* (directions are relative to the position of the steering wheel with respect to the driver, e.g., the surface of the steering wheel facing the driver is considered the front).

Figure 2:
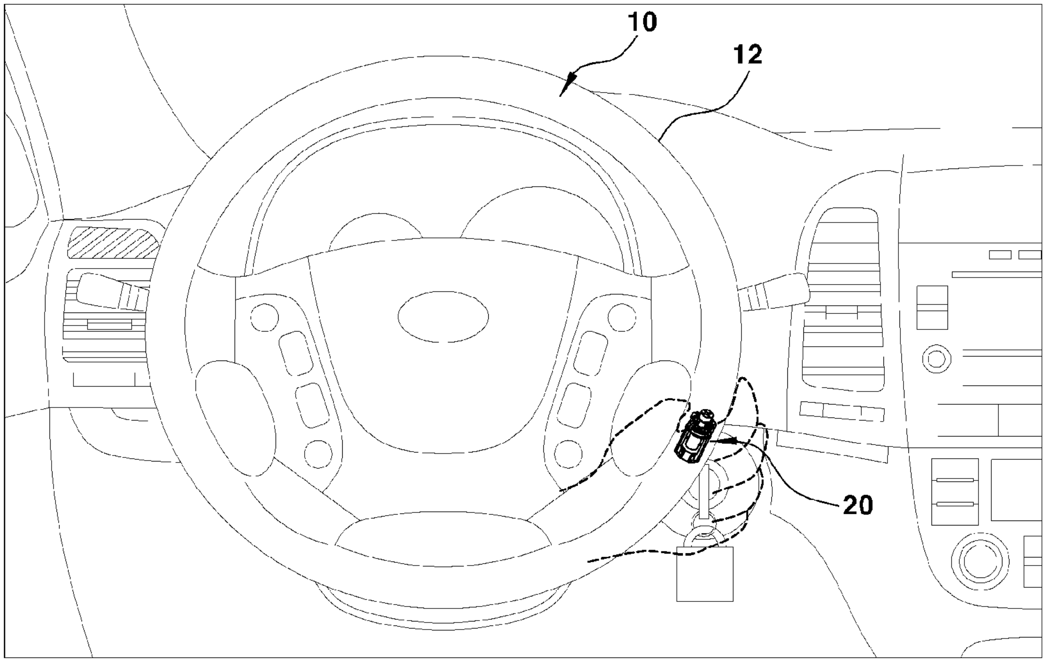
FIG. 2 is a schematic view illustrating an exemplary installation location of an input switch module within a steering wheel in accordance with the present invention.
Figure 4:
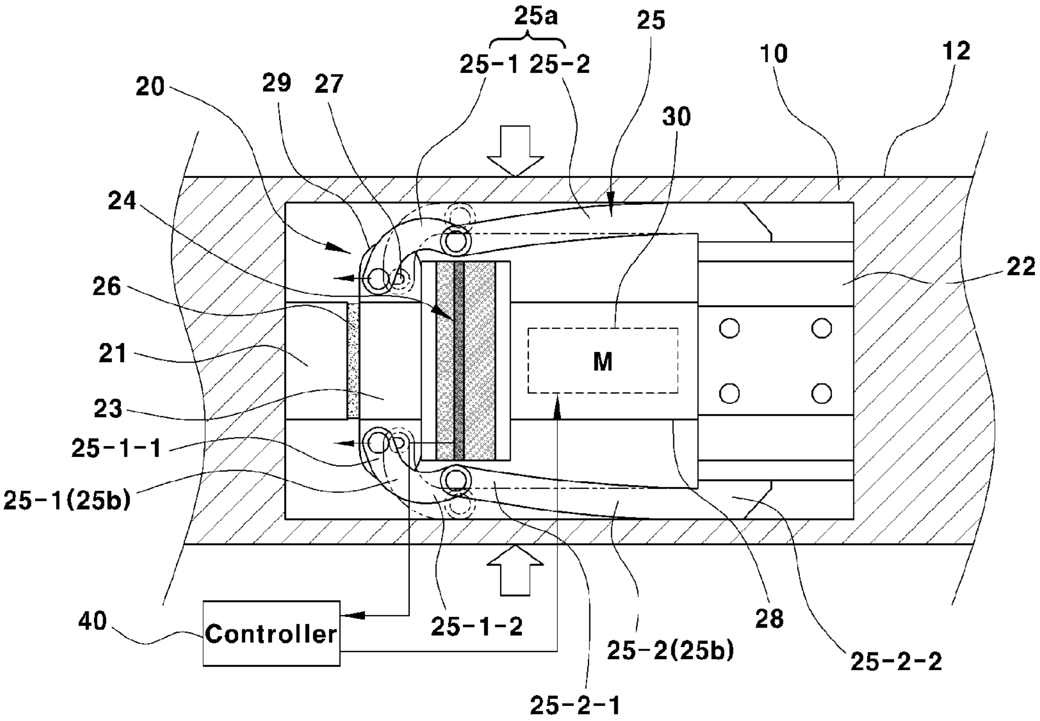
FIGS. 4 and 5 are cross-sectional views illustrating operational examples of the switch module built in the steering wheel in accordance with the present invention.

As shown in FIG. 2, the present invention has principal features in that an input switch module 20 having a six axis force-torque sensor 24 is installed within a grip portion 12 of a steering wheel 10 and at the same time, a feedback module 30 for providing a driver with a feeling of the switching operation is also disposed therein (see, e.g., FIG. 4). Hence, depending upon the driver's input to the input switch module 20 (such as, e.g., forward pressing, backward pressing, leftward pressing, rightward pressing, a twisting action of the grip portion, or the like), the switching output of the input switch module 20 within the grip portion 12 is generated, thereby activating the feedback module 30 and providing a feedback sensation (e.g. auditory signal or vibration) to the driver, confirming that the input switch module 20 was activated.

In other words, the switching output of the input switch module 20 within the grip portion 12 is activated by, for example, seven motions, and the driver can confirm the switching operation by, for example, feeling a vibration as a feedback of the switching output. For example, the seven motions may include: a force by a pushing motion while holding the grip portion (a pressing motion, while pushing the front surface of the grip portion); a force by a pulling motion while holding the grip portion (a pressing motion, while pulling the rear surface of the grip portion); a force by a brief pressing motion through firmly grasping the entire grip portion; a force by a torsional motion through twisting the grip portion leftward; a force by a torsional motion through twisting the grip portion rightward; a force by a torsional motion through twisting the grip portion in a left diagonal direction (counterclockwise) while wrapping the grip portion; and a force by a torsional motion through twisting the grip portion in a right diagonal direction (clockwise) while wrapping the grip portion.

Configurations of the input switch module 20 installed within the grip portion 12 of the steering wheel will be described hereinafter with reference to FIGS. 2 and 3.

Figure 3:
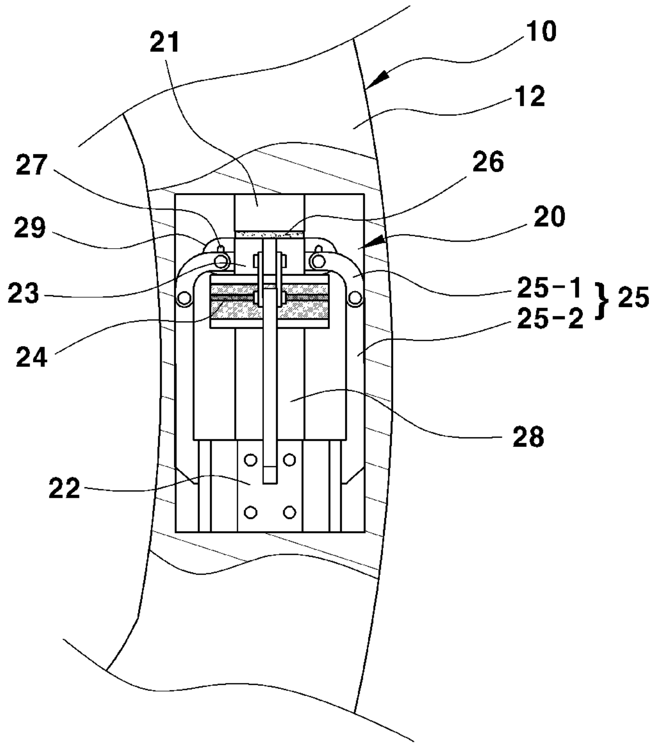
FIG. 3 is a cross-sectional view illustrating an exemplary embodiment of the input switch module within a steering wheel in accordance with the present invention.

As shown in FIG. 3, a first securing block 21 of the input switch module 20 is fixed to a first transverse section "line a" of the grip portion 12, while a second securing block 22 is fixed to a second transverse section "line b" of the grip portion 12. In one exemplary embodiment, a displaceable block 23 may be torsionally displaceably mounted on the inner side surface of the first securing block 21 by a bonding substance 26 of a flexible material.

In other words, since the bonding substance 26 of a flexible material is bonded at the boundary portion of the first securing block 21 and the displaceable block 23, a torsional action of the displaceable block 23 can be obtained in a clockwise or counterclockwise direction with respect to the first securing block 21. The inner side surface of the displaceable block 23 is integrally secured to the one side surface of the six axis force-torque sensor 24, a hollow type connecting block 28 is integrally mounted at the inner side surface of the second securing block 22, and the inner side surface of the connecting block 28 is integrally secured to the other side surface of the six axis force-torque sensor 24.

The six axis force-torque sensor 24 is employed as a conventional six axis force-torque sensor having a plurality of elastic beams (not shown), which are connected to the inner side surface of the displaceable block 23 and simultaneously connected to the inner side surface of the connecting block 28. Each elastic beam of the six axis force-torque sensor 24 has a mechanically deformed characteristic such as, e.g., a torsion beam that is twisted with an elastic restoring force when any force or torque is applied thereto.

A feedback module 30 may be installed within the connecting block 28, in which the feedback module 30 may be employed, for example, as a vibration motor (not shown) that is subject to vibrate along with the switching output of the input switch module 20.

In another embodiment, the feedback module 30 may be installed inside of the grip portion 12 separate from the input switch module 20. For example, the feedback module 30 may be separately installed within the grip portion 12 adjacent to either the first securing block 21 or the second securing block 22, so as to promptly transfer a feedback sensation of the switch operation to the driver's hands.

As shown in an exemplary embodiment of the invention in FIG. 4, a primary configuration for operating the input switch module 20 of the present invention includes a plurality of (e.g. four) input links 25 that are connected in the same spacing between the displaceable block 23 and the outer surface of the second securing block 22. The input links 25 serve to deliver a force or torque according to the driver's operating forces to the six axis force-torque sensor 24. The input links 25 include a pair of hinge links 25-1 that have a first end 25-1-1 pivotally engaged to a coupling end 29 integrally formed at the outer diameter surface of the displaceable block 23 by a hinge pin in a slot 27 of the coupling end 29, and a second end 25-1-2 pivotally engaged to a first end 25-2-1 of an elastic link 25-2, whose second end 25-2-2 is fixed to the outer diameter surface of the second securing block 22.

When the first end 25-2-1 end of the elastic link 25-2 pivotally engaged with the second end 25-1-2 of the hinge link 25-1 is pressed, the first end 25-2-1 of the elastic link 25-2 is twisted along the pressing direction about a fixed point, e.g., the second end 25-2-2 fixed to the second securing block 22, accumulating the elastic restoration force therein. Meanwhile, the six axis force-torque sensor 24 is connected to the input side of a controller 40 for outputting a signal thereto, and a vibration motor employed as the feedback module 30 is connected to the output side of the controller 40.

Operations of the switch module built in the steering wheel of the present invention as constructed above will be described hereinafter.

Referring to FIG. 4, if a driver makes a pressing motion by pushing the front surface of the grip portion 12 while holding the grip portion 12 of the steering wheel 10, the front surface (the surface facing the driver) of the grip portion 12 is pressed, which applies a pressing force to a front input link 25*a* out of the four exemplary input links 25.

Hence, the elastic link 25-2 of the front input link 25-1 is pressed by accumulating the elastic force therein and simultaneously pushes the hinge link 25-1 toward the first securing block 21. At the same time, the hinge link 25-1 is in a state to be translated toward the first securing block 21 along the slot 27 formed at the coupling end 29 of the displaceable block 23. At this moment, the six axis force-torque sensor 24 connected with the displaceable block 23 detects the force generated when the hinge link 25-1 is being translated and outputs a signal to the controller 40.

In turn, the controller 40 sends operating signals to activate specific functions of the device such as, e.g., an AVN a HUD, or the like, and at the same time transfers an operating signal to the vibration motor employed as the feedback module 30. The vibration motor then generates a vibration and the driver can feel a sensation of the switching operation by means of such a feedback vibration.

As shown in FIG. 4, when the driver makes a pressing motion by pulling the rear surface of the grip portion 12 while holding the grip portion 12 of the steering wheel 10, the rear surface of the grip portion 12 is pressed, which applies a pressing force to a rear input link 25*b* out of the four exemplary input links 25. Hence, the same operations as those made when the front input link 25*a* is pressed are performed to activate another specific function of the device such as, e.g., an AVN, a HUD, or the like.

Meanwhile, if the driver twists the grip portion 12 leftward or rightward while holding the grip portion 12 of the steering wheel 10, i.e., makes a torsional motion by twisting the grip portion 12 leftward or rightward, the pressing force is applied to a left input link 25*c* or a right input link 25*d* out of the four exemplary input links 25, respectively. Hence, the same operations as those made when the front input link 25*a* is pressed are performed to activate still another specific function of the device such as, e.g., an AVN, HUD, or the like.

Figure 5:
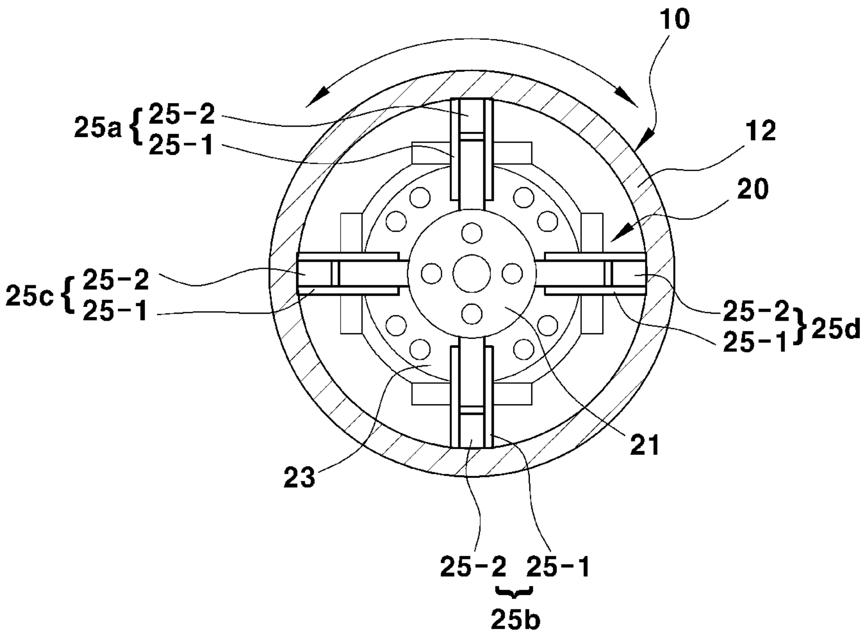

Referring to FIG. 5, when the driver makes a torsional motion by twisting the grip portion 12 in a left diagonal direction (clockwise) or in a right diagonal direction (counterclockwise) while wrapping the grip portion 12 of the steering wheel 10, a torsional torque is applied to the hinge link 25-1 of each input link 25 and a torsional torque is simultaneously delivered to the displaceable block 23 connected to the hinge link 25-1, such that a torsional action of the displaceable block 23 is achieved in a left or right direction about the bonding substance 26 of a flexible material. The six axis force-torque sensor 24 connected with the displaceable block 23 detects the torsional action of the displaceable block 23 and outputs a signal to the controller 40, which activates yet another specific function of the device such as an AVN (Audio, Video, Navigation), a Head Up Display (HUD) or the like.

Further, if the driver makes a brief pressing motion by firmly grasping the entire grip portion 12 while holding the grip portion 12 of the steering wheel 10, the pressing force is simultaneously applied to four input links 25*a*, 25*b*, 25*c* and 25*d*, which activates still yet another specific function of the device which needs switch operations thereof.

The invention has been described in detail with reference to exemplary embodiments thereof. However, it will be appreciated by those skilled in the art that changes may be made in these embodiments without departing from the principles and spirit of the invention, the scope of which is defined in the appended claims and their equivalents.

What is claimed is:

1. A switch module comprising:

an input switch module;

a feedback module; and a controller configured to receive signals from the input switch module and output a signal to a device and to the feedback module, the switch module being built into a grip portion of a steering wheel, wherein the input switch module comprises:

a first securing block with a first end and a second end, a displaceable block with a first end, a second end, and a circumferential portion, wherein the first end of the displaceable block is torsionally displaceably mounted to the second end of the first securing block by a bonding substance of a flexible material, a connecting block with a first end and a second end, wherein the first end of the connecting block is connected to the second end of the displacement block, and a six-axis force-torque sensor is sandwiched between the displacement block and the connecting block, a second securing block with a first end, a second end, and a circumferential portion, wherein the first end of the second securing block is mounted to the second end of the connecting block, and a plurality of input links connecting the circumferential portion of the displacement block to the circumferential portion of the second securing block, wherein the plurality of input links are equidistantly spaced around the circumferential surfaces of the displacement block and the second securing block, and configured to apply a force or a torque to the six-axis force-torque sensor.

2. The switch module of claim 1, wherein the bonding substance is a flexible material.

3. The switch module of claim 1, wherein the plurality of input links each comprise:

a pair of hinge links with a first end and a second end, wherein the first end is pivotally engaged to the circumferential surface of the displaceable block; and an elastic link with a first end and a second end, wherein the first end is pivotally connected to the second end of the pair of hinge links, and the second end is fixedly mounted to the circumferential surface of the second securing block.

4. The switch module of claim 3, wherein the first end of the pair of hinge links is pivotally engaged to the circumferential surface of the displacement block by a tab with a slot.

5. The switch module of claim 3, where in the second end of the elastic link is directly fixedly mounted to the circumferential surface of the second securing block.

6. The switch module of claim 3, where in the second end of the elastic link is fixedly mounted to the circumferential surface of the second securing block by a mounting bracket.

7. The switch module of claim 1, wherein the first end of the first securing block is mounted to a first internal surface of a steering wheel and the second end of the second securing block is mounted to a second internal surface of the steering wheel.

8. The switch module of claim 1, wherein the feedback module is located within the input switch module.

9. The switch module of claim 1, wherein the feedback module is located adjacent to the input switch module.

10. The switch module of claim 1, wherein the feedback module is located within the connecting block.

11. The switch module of claim 1, wherein the feedback module comprises a vibration motor configured to produce a vibration upon receiving the output signal from the controller.

12. The switch module of claim 1, wherein the device is selected from the group consisting of an audio system, a video system, a navigation system, a heating system, a cooling system, a head up display, a turn signal, a headlamp, a cruise controller, an interior light, and a seat position controller.

13. The switch module of claim 1, wherein the device is a head up display.

14. The switch module of claim 1, wherein the input switch module is configured to send different signals to the controller that correlate with different motional operations by a driver.

15. The switch module of claim 14, where the motional operations are selected from the group consisting of a push motion, a pull motion, a pressing motion, a leftward torsional motion, a rightward torsional motion, a wrapping motion in a left diagonal direction, and a wrapping motion in a right diagonal direction.

16. A steering wheel, comprising:

a switch module built into a grip portion of the steering wheel, the switch module comprising:

an input switch module;

a feedback module; and a controller configured to receive signals from the input switch module and output a signal to a device and to the feedback module, wherein the input switch module comprises:

a first securing block with a first end and a second end, a displaceable block with a first end, a second end, and a circumferential portion, wherein the first end of the displaceable block is torsionally displaceably mounted to the second end of the first securing block by a bonding substance of a flexible material, a connecting block with a first end and a second end, wherein the first end of the connecting block is connected to the second end of the displacement block, and a six-axis force-torque sensor is sandwiched between the displacement block and the connecting block, a second securing block with a first end, a second end, and a circumferential portion, wherein the first end of the second securing block is mounted to the second end of the connecting block, and a plurality of input links connecting the circumferential portion of the displacement block to the circumferential portion of the second securing block, wherein the plurality of input links are equidistantly spaced around the circumferential surfaces of the displacement block and the second securing block, and configured to apply a force or a torque to the six-axis force-torque sensor, and the first securing block of the input switch module is fixed to a first transverse section of the grip portion of the steering wheel, while the second securing block is fixed to a second transverse section of the grip portion 12 of the steering wheel.

* * * * *